(12) United States Patent
Bothe et al.

(10) Patent No.: US 7,002,785 B1
(45) Date of Patent: Feb. 21, 2006

(54) APPARATUS FOR PROTECTING ELECTRONIC CIRCUITRY

(75) Inventors: Michael Bothe, Ladbergen (DE); Armin Wegener, Telgte (DE); Juergen Heydecke, Halver (DE); Ingmar Knop, Aalen (DE); Klaus Goebel, Munich (DE); Klaus-Dieter Skwirblies, Forstinning (DE); Rainer Peters, Unterhachung (DE)

(73) Assignees: FRIWO Geraetebau GmbH, Ostbevern (DE); VARTA AG, Hannover (DE); Siemens AG, Munich (DE)

( * ) Notice: Subject to any disclaimer, the term of this patent is extended or adjusted under 35 U.S.C. 154(b) by 0 days.

(21) Appl. No.: 09/180,699

(22) PCT Filed: Feb. 13, 1997

(86) PCT No.: PCT/EP97/00689

§ 371 (c)(1),
(2), (4) Date: Jan. 7, 2002

(87) PCT Pub. No.: WO97/43812

PCT Pub. Date: Nov. 20, 1997

(30) Foreign Application Priority Data

May 15, 1996 (DE) ................................ 196 19 631
Nov. 14, 1996 (DE) ................................ 196 47 035

(51) Int. Cl.
*H02H 5/00* (2006.01)

(52) U.S. Cl. .................. 361/103; 361/104; 361/118
(58) Field of Classification Search ............... 361/115, 361/103, 104, 105, 106, 118, 88, 86, 91.7, 361/120, 124
See application file for complete search history.

(56) References Cited

U.S. PATENT DOCUMENTS 5,311,164 A * 5/1994 Ikeda et al. .................. 337/28

FOREIGN PATENT DOCUMENTS

| DE | 41 27 179 A | 2/1993 |
| EP | 0 130 403 | 1/1985 |
| EP | 0 171 117 A | 2/1986 |
| EP | 0 270 044 | 6/1988 |
| EP | 0 643 272 A | 3/1995 |
| FR | 2 732 098 A | 9/1996 |

* cited by examiner

Primary Examiner—Stephen W. Jackson
(74) Attorney, Agent, or Firm—Townsend and Townsend and Crew LLP

(57) ABSTRACT

A device for protecting the electronic circuitry of electrical appliances against damage from unacceptably high voltages. An element is interposed in the power supply paths which limits the application of an externally supplied excessive voltage to a predetermined time interval and which completely interrupts the current flow when the excessive voltage and current causes a heat build-up. This is accomplished by interposing pairs of spaced-apart solder surfaces at at least one point along the current paths to the electronic circuitry. One solder surface of each pair is connected to the power supply and the other to the power consumer. An element is soldered to the respective solder surfaces of the pairs and electrically closes the current path. A mechanically prestressed spring engages the element and reliably separates it from the solder surfaces when the solder melts due to excessive heating.

15 Claims, 1 Drawing Sheet

APPARATUS FOR PROTECTING ELECTRONIC CIRCUITRY

The invention relates to a device for protecting electronic circuitry and/or an attached electric appliance or device against unacceptably high electric energy pulses.

For supplying electric appliances such as telephones and the like with electricity, or for charging their batteries, an electric plug connection normally connects them with an electric power supply or a battery charger. Protective circuitry prevents damage to the appliance from an excessively high voltage or overload, and typically has a regulator, such as a series or shunt regulator with a transistor, a Zener diode, or the like. Such appliances have the drawback that their electronic circuitry can be destroyed when subjected to an unacceptably high voltage, for example because they were used with unsuitable power supplies or battery chargers which might be attached with appropriate adapters.

In view thereof, the present invention seeks to prevent the destruction of protective circuitry by disconnecting the power supply or battery charger when the current or voltage is unacceptably high.

This is accomplished in accordance with the characterizing portion of claim 1.

When the appliance is connected to a power supply or a battery charger which subjects it to an unacceptably high energy supply, the present invention both limits the excess voltage and opens or interrupts the electric circuit if the high energy level causes a heat-up. In this manner the entire appliance is protected.

The protective element is simple. In one preferred embodiment, two spaced-apart solder surface pairs are interposed at at least one point of the electric conductors.

One of the solder surfaces is connected with the current supply and the other one with the current consumer. The protective element extends between and thereby connects the two solder surfaces of each pair. A spring mechanically prestresses the protective element so that, when the solder melts, the element becomes separated from the associated solder surface pair. The spring can be a leaf spring which has at least one shoulder that extends through a slit in the circuit board and presses against the connecting element. It is relatively easy to attach the leaf spring to the circuit board. One of its ends can be positioned in a cutout along the edge of the circuit plate and is provided with lateral extensions that are supported on the circuit plate. The other end of the leaf spring can be provided with a snap lock forming hook that extends through an opening in the circuit plate. To simplify the connections, the conductive lines on the circuit board are provided with solder surfaces for connection to the power supply conductors. Solder surfaces for the diode are arranged side by side and located beneath the connecting points of the diode. For soldering the protective elements, a solder is preferably chosen which has a well-defined melting point that is selected for melting at a predetermined, acceptable temperature. For example, the protective element can be a suppression diode which establishes the predefined voltage value. The current user might be a storage battery or cell which, together with the protective element, is arranged in a housing. The protective element is particularly useful for use with batteries that have at least one Li-Ion-cell.

An example of the invention is shown in the following drawings.

Figure 1:
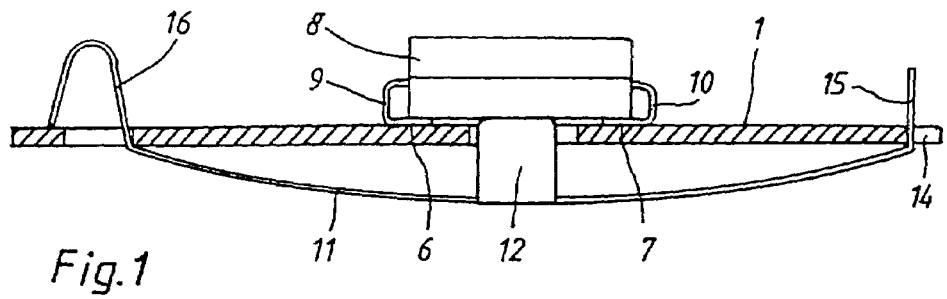
FIG. 1 is an enlarged, longitudinal cross-section of the protective arrangement of the present invention.
Figure 2:
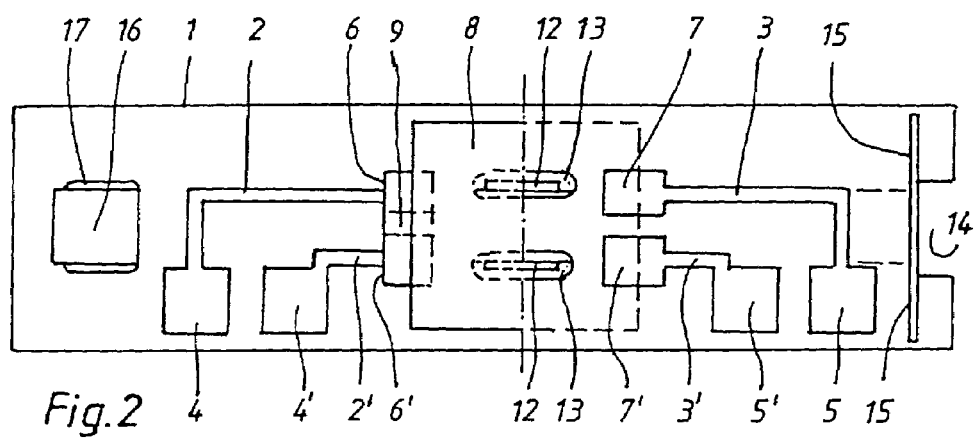
FIG. 2 is a plan view of the arrangement shown in FIG. 1.
Figure 3:
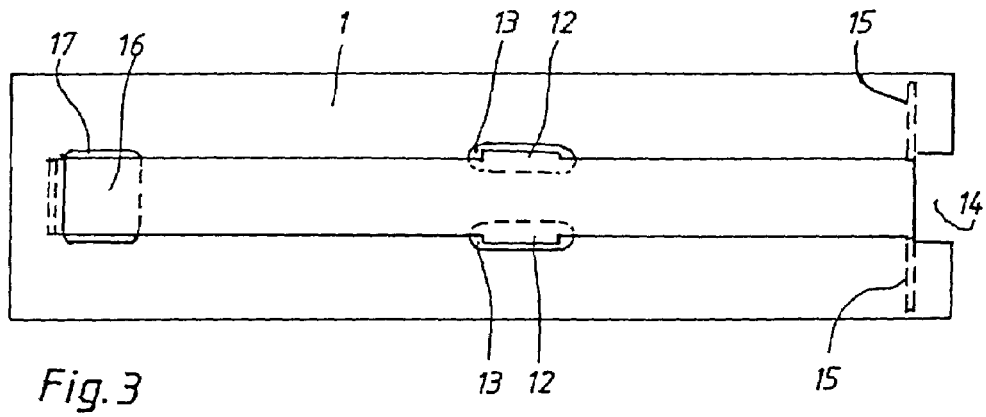
FIG. 3 is an underneath view of the arrangement shown in FIG. 1.
Figure 4:
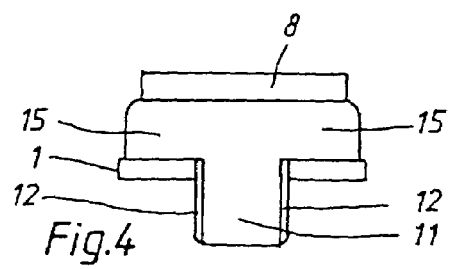
FIG. 4 is a side elevational view of the arrangement shown in FIG. 1.

The components of the protective arrangement are mounted on a printed circuit board 1 made of an appropriate synthetic material such as epoxy resin. Circuit board 1 has four current paths 2, 2', 3, 3' which have solder surfaces 4, 4', 5, 5'. Solder surface 4 is for connection to the negative terminal of the power supply or battery charger. Solder surface 4' is for connection to the negative terminal of the electronic appliance circuitry. Correspondingly, solder surfaces 5, 5' are connected to the positive sides of the power supply or battery charger and of the electronic appliance circuitry, respectively. The other ends of current paths 2, 2', 3, 3' have solder surfaces 6, 6', 7, 7'. The surfaces of each pair are spaced apart and positioned beneath connecting points 9, 10 of the protective element, for example a diode 8 which may comprise a suppressor diode. Connecting points 9, 10 of diode 8 are soldered to solder surfaces 6, 6', 7, 7' to enable current flow from current paths 2, 2' and 3, 3' via connecting points 9, 10. The solder for diode 8 is a soft solder that is chosen so that it melts at a preselected temperature.

A spring, in the form of leaf spring 11, forms an important part of the invention and is arranged beneath circuit board 1. Two lateral shoulders 12 extend from a midportion of the spring through slots 13 in circuit plate 1, engage the underside of diode 8, and exert a spring force against it. One end of spring leaf 11 is bent upwardly and extends through an edge cutout of circuit plate 1. That spring end also has two lateral shoulders 15 which engage and are supported by circuit board 1. The other end of spring leaf 11 has a locking hook 16 that extends through an opening 17 in the circuit board 1 and forms a snap lock. The end of the hook is supported on the surface of the circuit board. In this manner, both ends of leaf spring 11 are fixedly attached to circuit board 1 and generate a spring force directed towards the circuit board.

During normal operation, a negligible current flows through diode 8. In the event a wrong connection generates an unacceptably high voltage, the solder at solder surfaces 6, 6', 7, 7' softens and melts. The spring force generated by leaf spring 11 pushes the diode upwardly away from solder surfaces 6, 6', 7, 7', thereby interrupting the current paths and attaining the desired protection of the appliance circuitry.

PARTS LIST 1 circuit plate
2 conductor
2' conductor
3 conductor
3' conductor
4 solder surface
4' solder surface
5 solder surface
5' solder surface
6 solder surface
6' solder surface
7 solder surface
7' solder surface
8 diode (element)
9 connecting point
10 connecting point
11 leaf spring
12 shoulder 13 slot
14 edge cut-out
15 shoulder
16 locking hook
17 opening

What is claimed is:

1. Apparatus for protecting electric circuitry and/or an electric consumer against damage from excessive electric energy comprising a voltage limiting element which has connecting parts which are coupled to current paths of the consumer via soldering surfaces and a spring which subjects the soldering surfaces to mechanical prestress so that, in the event of a loss of the soldering connection, the element is lifted off the soldering surface and separated from the current paths, wherein for each of two current paths one conductor is provided on a circuit plate which is interrupted by pairs of soldering surfaces, wherein one of the soldering surfaces is coupled to a current source and the other is connected to the consumer, wherein connecting parts of the element are soldered together at the pair of soldering surfaces, and wherein a leaf spring which has at least one shoulder extends through a slot in a circuit plate and pushes against the element.

2. Apparatus according to claim 1 wherein the conductors have solder surfaces for connection to the current paths and the soldering surfaces for the element are next to each other beneath the connecting parts of the element.

3. Apparatus according to claim 1 including a soldering material for soldering the element which has a defined melting point that is a function of a predetermined, permissible heating temperature.

4. Apparatus according to claim 1 wherein the element comprises a suppressor diode which sets a predetermined voltage value.

5. Apparatus according to claim 1 wherein the consumer comprises a storage battery.

6. Apparatus according to claim 5 wherein the protective element and the storage battery are arranged in a housing.

7. Apparatus according to claim 5 wherein the storage battery comprises at least one Li-Ion-cell.

8. Apparatus for protecting electric circuitry and/or an electric consumer against damage from excessive electric energy comprising a voltage limiting element which has connecting parts which are coupled to current paths of the consumer via soldering surfaces and a spring which subjects the soldering surfaces to mechanical prestress so that, in the event of a loss of the soldering connection, the element is lifted off the soldering surface and separated from the current paths, wherein for each of two current paths one conductor is provided on a circuit plate which is interrupted by pairs of soldering surfaces, wherein one of the soldering surfaces is coupled to a current source and the other is connected to the consumer, wherein the connecting parts of the element are soldered together at the pair of soldering surfaces, and wherein one end of a leaf spring lies in an edge cutout of a circuit plate, lateral sides of the spring lie on the circuit plate, and another end of the spring has a locking hook which extends through an opening in the circuit plate.

9. Apparatus according to claim 8 wherein a leaf spring which has at least one shoulder extends through a slot in the circuit plate and pushes against the element.

10. Apparatus according to claim 8 wherein one end of the leaf spring lies in an edge cutout and lateral sides on the circuit plate and wherein the other end has a locking hook which extends through an opening in the circuit plate.

11. Apparatus for protecting electric circuitry and/or an electric consumer against damage from excessive electric energy comprising a voltage limiting element which has connecting parts which are coupled to current paths of the battery via soldering surfaces and a spring which subjects the soldering surfaces to mechanical prestress so that, in the event of a loss of the soldering connection, the element is lifted off the soldering surface and separated from the current paths, wherein for each of two current paths one conductor is provided on a circuit plate which is interrupted by pairs of soldering surfaces, wherein one of the soldering surfaces is coupled to a current source and the other is connected to the battery, wherein connecting parts of the element are soldered together at the pair of soldering surfaces, and wherein the electric consumer comprises a storage battery.

12. A device for protecting an electronic circuit and an electric power supply from unduly high electric energy, the device comprising a circuit board, spaced- apart first and second sets of spaced-apart first and second soldering surfaces, first and second strip conductors on the circuit board defining first and second, separate current paths for connection to the electronic circuit and the power supply, respectively, the first and second strip conductors being electrically coupled to the first and second soldering surfaces, respectively, of each set, a protective component having connectors, solder attaching the connectors of the component to the first and second sets of soldering surfaces, and a prestressed spring connected with the circuit board and engaging the component so that upon a softening or melting of the solder the spring moves the component away from and out of contact with at least some of the soldering surfaces.

13. A device according to claim 12 wherein the soldering surfaces for the component are disposed side by side beneath the connectors of the component.

14. A device according to claim 12 wherein the solder has a melting point defined in dependence on a fixed, permissible heating temperature for the solder.

15. A device according to claim 12 wherein the component comprises a voltage limiting component.

* * * * *